United States Patent [19]

Rostaing et al.

[11] Patent Number: 5,242,740
[45] Date of Patent: Sep. 7, 1993

[54] MULTILAYER COATING FOR POLYCARBONATE SUBSTRATE

[75] Inventors: Jean-Christophe Rostaing, Versailles; Francois Coeuret, Guyancourt, both of France

[73] Assignee: L'Air Liquide, Societe Anonyme pour l'Etude et l'Exploitation des Procedes Georges Claude, Paris, France

[21] Appl. No.: 847,309

[22] Filed: Mar. 6, 1992

[30] Foreign Application Priority Data

Mar. 6, 1991 [FR] France ................... 91 02662

[51] Int. Cl.$^5$ .................... B32B 27/36; C23C 16/50; G02B 5/28
[52] U.S. Cl. ......................... 428/212; 428/333; 428/412; 428/446; 428/698; 351/163
[58] Field of Search .......... 428/412, 212, 333, 446, 428/698

[56] References Cited

U.S. PATENT DOCUMENTS 4,609,267 9/1986 Deguchi et al. ................. 351/163

FOREIGN PATENT DOCUMENTS 0185189 6/1986 European Pat. Off. .
0284693 10/1988 European Pat. Off. .

Primary Examiner—P. C. Sluby
Attorney, Agent, or Firm—Young & Thompson

[57] ABSTRACT

Multilayer coating for polycarbonate substrate used as a glass substitute, consisting essentially of silica, oxygen and nitrogen, and hydrogen according to the formula $SiO_2:H$ $SiN_y:H$ characterized by a composite structure of the coating combining an interferential system with a reflectance window extending over a narrow band of wavelengths from the lower edge of the visible region toward wavelengths shorter than ultraviolet on the one hand, and an absorptive system of which the band of wavelengths of transmission from the absorptive region to the transparent region is located in the reflectance window of the interferential system. There is thus provided a coating with an abrupt variation of coefficient of transmission. The multilayer coating is particularly useful as a glass substitute for automobile headlight lenses.

3 Claims, 4 Drawing Sheets

MULTILAYER COATING FOR POLYCARBONATE SUBSTRATE

FIELD OF THE INVENTION

The present invention relates to a multilayer coating for polycarbonate substrate used as a glass substitute, or other transparent polymeric materials which have at present the tendency to replace glass for various applications such as automobile headlight lenses, eyeglass lenses, etc. Among these, polycarbonate is particularly desirable, especially for its excellent resistance to shock. However, the use of this material is limited by its poor behavior under radiation and the accelerating aging which it undergoes under the effect of natural ultraviolet radiation. It is therefore necessary to protect the polycarbonate at least against these two causes of degradation, it being understood that other operational requirements can be fulfilled as a function of a particular application.

BACKGROUND OF THE INVENTION

At present, protective coatings for polycarbonate available commercially are acrylic lacquers, organosilicones or polysiloxanes applied by powder technique or immersion, if desired dried by ultraviolet. It has been proposed to replace these coatings by amorphic alloys of silicon deposited at ambient temperature by PECVD ("plasma enhanced chemical vapor deposition") from silane. Such a process is for example described in French patents 2,614,317 and 2,631,346. One of the major problems to be solved is to ensure good resistance of the coating to large variations of temperature, given the differences of coefficients of expansion of the layer and of the substrate, even though these products are subject to strict specifications as to behavior as to cycles and thermal shock.

In French application No. 90.05529 of May 2, 1990 in the name of the applicant, an anti-UV coating of the absorptive type has been proposed, using an amorphous alloy of silicone deposited by PECVD from silane, of which the cracking threshold is adjusted via the composition by choosing appropriate values of the different gas flows. If an improvement of the behavior under ultraviolet radiation (UV) is effectively observed for moderate radiation densities (laboratory UV lamp), the coatings effected generally do not pass the accelerated tests under very strong intensity recommended by standardization groups.

This behavior can be explained if one considers the variation of the coefficient of absorption in semiconductors and amorphous insulators. At low energy, the absorption results from transitions between localized conditions of the intercepted band. It is much less intense and the corresponding spectral region is considered as transparent. At medium energy, the absorption results from transitions between localized states at the edge of the band of valence and of conduction, which result from the partially disordered structure of the material, and extended conditions of the opposite band. The experimental form of the coefficient of absorption in this zone is called "Urbach's tail" and is well described by the relationship:

$$\alpha = \alpha_0 \exp(h\nu - E_1)/E_0)$$

in which $\alpha_0$ and $E_1$ are independent of disorder. $E_0$ measured 1' "extension" of the Urbach tail and constitutes an indirect measure of the structural disorder.

Finally, at high energy, the absorption results from electronic transitions between widespread states from band to band. It is currently described by the Tauc's law:

$$(\alpha h\nu)^{\frac{1}{2}} = B(H - E_G).$$

The parameter B is representative of the "speed of variation" of $\alpha$ at high energy, while $E_G$ defines the threshold energy of the photon, above which the material can be considered as totally opaque. By analogy with crystalline solids, $E_G$ is called width of absorbed optical band (optical "gap").

To produce an absorptive UV filter, there is deposited an amorphous alloy of silicon whose optical "gap" will be adjacent the limit between the visible and the ultraviolet. The ideal filter should have a profile that is in the form of a stair step so as to stop all UV radiation while remaining completely transparent in the visible range. This is far from being the case in practice.

If one considers the coefficient of experimental transmission of a layer of an alloy a-SiN$_y$:H of which the "gap" is about 350 nm, of about 1 $\mu$m thickness, as a function of the wavelength, there will be noted three zones characteristic of the different kinds of absorption, mentioned previously: quasi-transparent, Urbach tail, strong "parabolic" absorption. The transition between semi-transparency and substantially no transmission has a band of wavelength which is far from being negligible. If this region is centered on the limit UV/visible (about 350 nm), certain wavelengths of the visible (violet-blue) are particularly attenuated, giving rise to the yellowish coloration of the specimen, although a portion of the UV spectrum is transmitted, particularly around 365 nm, a wavelength very damaging to polycarbonate. If one uses a material of smaller "gap", so as to render the transmission substantially zero over all the UV range, the film will appear dark yellow orange or even brownish (color characteristic of amorphous silicon). Few applications are known in which this characteristic would be acceptable. One cannot on the other hand hope to act on the optical properties of the material to reduce the width of the transition between weak and strong absorption, which is to say to increase the multiplier B of the. Tauc's law and reduce the parameter $E_0$. Thus, it appears that B and $E_0$ will be, in the first instance, functions uniquely of the relative incorporation of oxygen, nitrogen, hydrogen relative to silicon, which is dictated by the choice of the value of the optical "gap".

Another theoretical solution would be to reinforce the slope of the gap by increasing the thickness of the deposited absorbent material, the transmission varying in the range of strong absorption as $\alpha$ (n,k) $e^{-\alpha d}$ in which $\alpha$ is a rational function. The simulation shows that the necessary thicknesses will be several microns, which is entirely unrealistic both technologically and economically. Thus, the thermomechanical specifications are ever more difficult to achieve, the greater the thickness of the layers. On the other hand, the absorbent layer is formed from a sub-stoichiometric material of medium hardness and should be associated with a distinctly hard structural layer, also of several microns. The cumulative thickness of material, and hence the time to produce the film, will thus be greatly increased.

Until now, the anti-UV function for a polycarbonate has been produced only for coatings deposited from liquid. An appropriate absorbent molecule is included in the product to be applied. It can be a matter, according to the case, of only the primary adherence (thickness about 1 μm) or of the assembly of the coating (thickness about 5 μm). It will be seen that the results of tests are unsatisfactory except in this last case.

The coatings deposited by PECVD generally require a first liquid adherence which also ensures the anti-UV effect, with the restrictions that have been mentioned. There is no known analog, in PECVD, to the molecules absorptive of UV employed in the case of varnish. The requirement to add in some way a layer applied from a liquid to the PECVD process would sink the project economically.

Another very important factor to be taken into account is the thermomechanical behavior of the anti-UV filter itself. In French patent application 90.05529 of May 2, 1990, there is described the production of absorptive UV filters from oxides, oxynitrides and nitrides of silicon which is hydrogenated but slightly carbonated. For certain applications, very severe accelerated tests are imposed, by exposure to a Xenon arc lamp ($\approx 0.1$ W/cm$^2$) for 2,000 hours. However, there has been noted a certain very rapid degradation of the oxide and oxynitride materials during this test, with opening of the optical "gap" and loss of the selective absorption properties.

Only the material called "nitride" which is to say deposited solely from silane and nitrogen, is not deteriorated by the accelerated course.

However, this material has among other things a very serious drawback, namely its mediocre thermomechanical behavior. If one produces the following structure according to the process described in FR-2,631,346, namely: activation of the polycarbonate, adhesive layer of Si:H, anti-UV layer SiN$_Y$:H, hard layer SiO$_2$:H, the specimen obtained will not resist conventional thermal cycle tests.

Given the good thermomechanical behavior of layers of silica, there have been produced specimens in which a layer of SiO$_2$:H is inserted between the adhesive layer and the anti-UV layer SiN$_y$:H. Experience shows that a significant improvement of the thermomechanical properties is obtained only with a prohibitively thick intermediate layer of silica. The performance is nevertheless still insufficient with respect to the specific certain users.

SUMMARY OF THE INVENTION

The present invention provides a coating for a substrate of the polycarbonate type, effecting both an abrupt transmission threshold at the UV/visible limit and a production of specimens of polycarbonate thus coated with the anti-UV filter and a hard structural layer which will be resistant to cycles and to thermal shocks, and these objectives of the invention are achieved by a composite structure of coating combining an interferential system with a reflectance window extending over a narrow band of wavelengths from the lower edge of the visible region toward wavelengths shorter than ultraviolet on the one hand, and an absorptive system of which the band of wavelengths of transmission of the absorption range to the transparency range is located in the reflectance window of the interferential system.

It will thus appear that the use of the absorption concept alone will not permit obtaining a sufficiently abrupt cutoff, from which one goes to an interferential system, which is not generally envisaged for this type of application, because it is difficult in a PECVD process to control within narrow limits (several %) the thickness and the index of the layers over all the surface of an article of plastic material, especially if it is of awkward shape. But in reality, this difficulty arises in the same way for an absorptive filter, in which the position of the transmission threshold is very sensitive to the composition of the material.

To make an interference filter, there are stacked up alternate layers of two materials, one of high index $n^H$ and the other of low index ns, the thicknesses of the layers $d_H$ and $d_B$ being so chosen that $$n_H d_H = (2k+1) \cdot \lambda_0 / 4$$

$$n_B d_B = (2k'+1) \cdot \lambda_0 / 4$$

in which k and k' are whole numbers; the filter will have a peak of reflectance about $\lambda_0$.

To widen the reflectance band, one can however stack several filters whose peaks of rejection are adjacent.

However, even in the most favorable case in which $k = k' = 0$, these peaks are narrow and one cannot arbitrarily increase the number of filters. The cumulative thickness of the material could become prohibitive as to thermomechanical properties, as to production time and also as to the length of coherence of the natural light, and the solution proposed by the invention combines the absorptive and interferential concepts in the following manner:

a certain number of interferential filters are stacked, so as to obtain a reflectance window extending in the ultraviolet from the limit of the visible range (about 380 nm). As it has been noted that there is a practical limit to the number of filters, if materials transparent to UV are used, the transmission of the structure will be on the order of unity for wavelengths of the order of 200 to 300 nm, in a range in which there exist various rays harmful to polycarbonate, this undesirable increase of transmission is cancelled by an absorptive device in the spectral field under consideration, but transparent in the visible field. More precisely, the absorbent material is so chosen that the limit of its transparency range exactly coincides with the cutoff (or window of reflectance) of the interferential device at the edge of the visible field, or, in other words, that the band of wavelengths of the reflectance window of the interferential system overlaps substantially the band of wavelengths of transmission of the absorptive system, the two functions can be preferably ensured by the same assembly of layers. To this end, one uses as the material of low index a quasi-stoichiometrically hydrogenated silica, a-SiO$_2$:H and as high index material a sub-stoichiometrically hydrogenated nitrate, a-SiN$_y$:H, absorbent of UV, with y of the order of 1.2 to 1.5.

There result two favorable further consequences from an optical standpoint:
a) the material a-SiN$_y$:H has a refractive index higher than the quasi-stoichiometric nitride a-Si$_3$N$_4$:H, which increases the effectiveness of the interferential filter and permits reducing the number of layers, b) the attenuation of the radiation by absorption is increased by an increase in the net path of the wave because of multiple reflections in the alternate multilayers.

On the other hand, this conception gives rise as a corollary to another crucial advantage from the point of view of the thermomechanical properties. It has been seen that in fact a-SiN$_y$:H is the only one among the absorbent materials available which resists accelerated aging tests from UV, but that its mediocre thermomechanical properties prevent contemplating its use in thick layers (of the order of 1 μm). On the other hand, a-SiO$_2$:H has remarkable thermomechanical properties. Structures can therefore be envisaged in which the thin layers of a-SiN$_y$:H alternate with layers of a-SiO$_2$:H so as to distribute and absorb the strains. At least a portion of the thermomechanical problems are thus solved, with the reservation that the layer thicknesses necessary be compatible with those required by the optical function. These latter will be 500 to 600 Å for the nitride a and slightly more for silica.

DETAILED DESCRIPTION OF THE INVENTION

A way of embodying the invention will now be described with reference to FIGS. 1 and 2, which show respectively diagrams of the refractive index and of the coefficient of absorption as a function of energy (eV). To adjust an anti-UV filter, one follows the transmission of the system constituted by this filter disposed on a transparent substrate in the spectral field considered, in this case a sheet of cast silica. This is not exactly representative of the problem that arises, because the truly significant size is the spectral density of electromagnetic energy entering a polycarbonate substrate. This latter can differ substantially from the energy transmitted by the system comprised by the filter disposed on a transparent substrate of quartz. There also exist certain difficulties to agree on the energy effectively entering into the absorbent medium such as the polycarbonate in ultraviolet, because the shape of the electromagnetic wave is then complex and is no longer represented by classical concepts of waves reflected and transmitted. But it can be reasonably supposed that the transmission measured for quartz is a good approximation, in the first instance, of the actual functional characteristics of the filter. The definitive adjustment could then be effected, as the case may be, by comparing the behavior of the UV tests of several adjacent structures.

Research on a function of appropriate transmission, using actual structures, will be seen to be extremely long and troublesome with simple laboratory deposition equipment. It is therefore indicated to use a simulation tool consisting of a library of spectra of optical constants of the different materials a-SiN$_y$:H accessible by the deposition process, complemented by software for the calculation of the transmission of any multilayer structure formed from these materials. One could thus test a large number of configurations in a reasonable time, to distinguish the effects of the different parameters of conception and optimization of a given structure.

It should particularly be remembered that the absorptive and interferential aspects are not independent, to the extent that the index of refraction of the materials may vary substantially in an absorption region, requiring a consequential refinement of the concept of the filter.

The optical constants (n, k) of the materials are determined over the range of wavelengths of interest by any appropriate experimental means. There can be chosen spectroscopic ellipsometry which delivers the results with an entirely acceptable precision for the present application.

Figure 1:
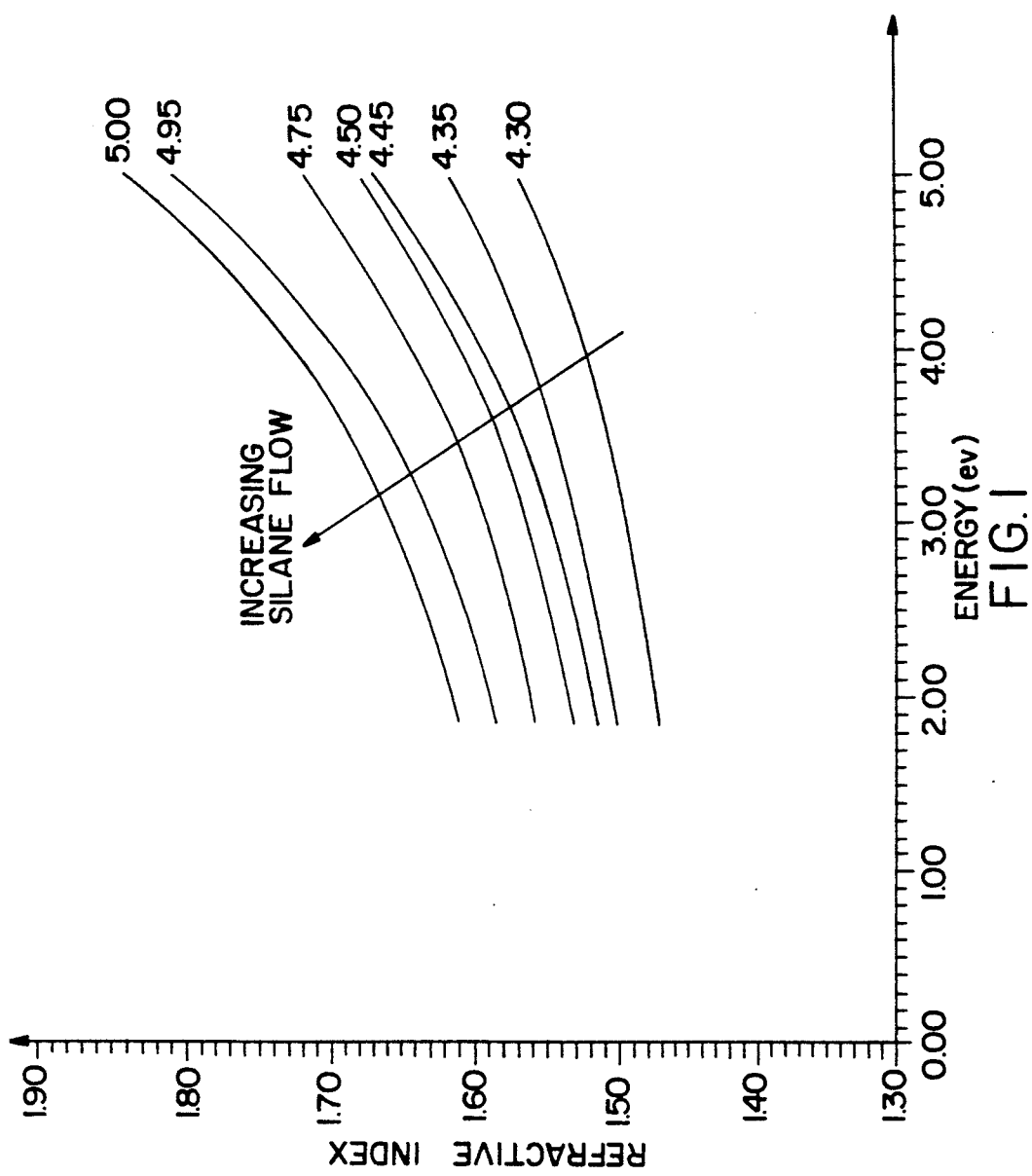
Figure 2:
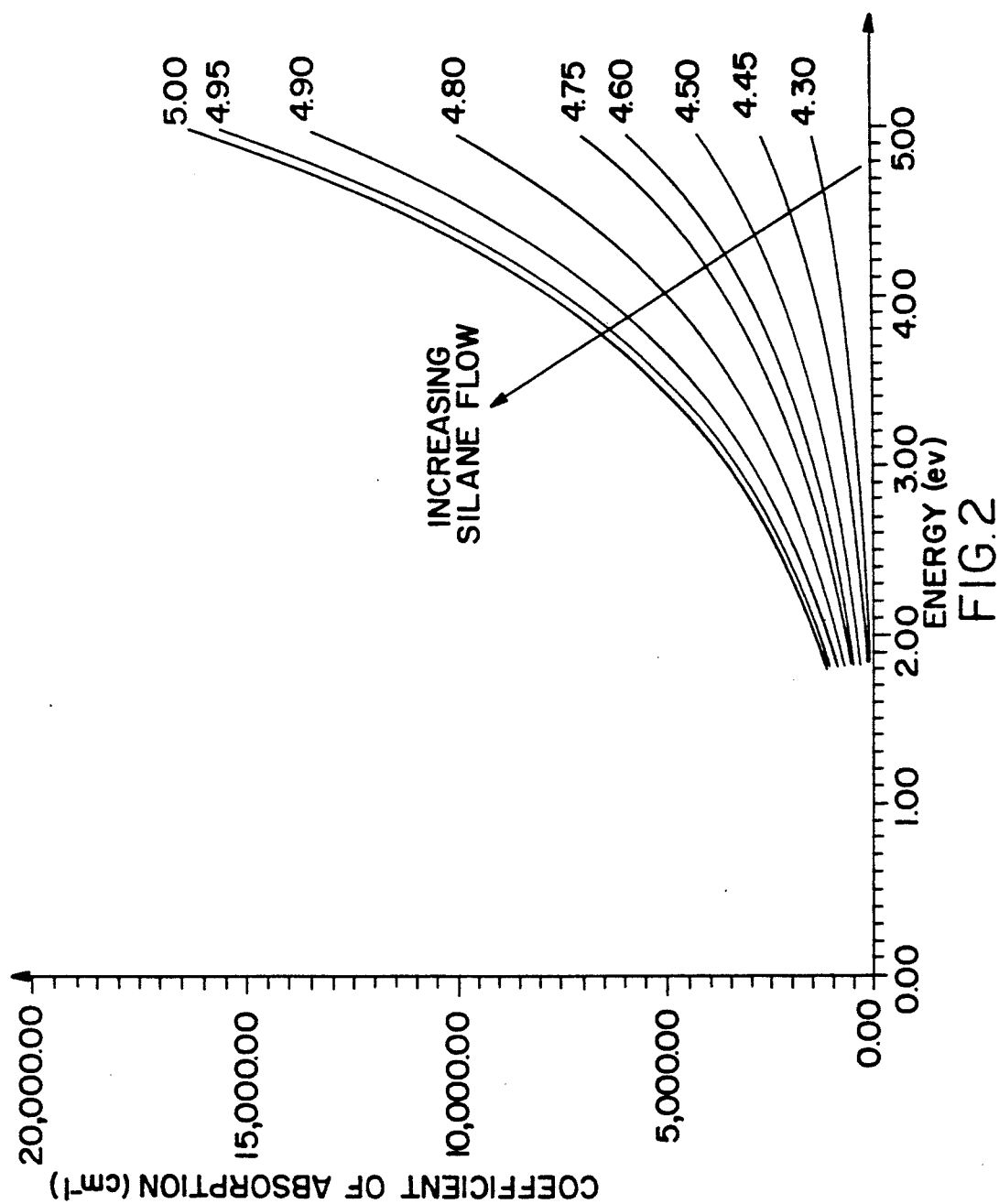

The results are displayed on FIGS. 1 and 2.

It will be seen in particular that the refractive indices (FIG. 1) remain remarkably low. The reliability of these values has been verified moreover and it appears, in accordance with the results in the literature, that these materials deposited at substantially ambient temperature will be more diimides than nitrides.

From these spectra of n and k, a structure corresponding to the previously set forth optical specifications has been conceived by successive refinement, whose composition is the following:

| | | |
|---|---|---|
| SiO$_2$:H | 1000Å | |
| SiN$_{y1}$:H | 390Å | |
| SiO$_2$:H | 530Å | } × 2 layers |
| SiN$_{y1}$:H | 390Å | |
| SiO$_2$:H | 620Å | } × 6 layers |
| SiN$_{y1}$:H | 480Å | |
| SiO$_2$:H | 700Å | } × 6 layers |
| SiN$_{y1}$:H | 560Å | |
| SiO$_2$:H | 740Å | } × 6 layers |
| SiN$_{y2}$:H | 620Å | |
| SiO$_2$:H | 3.0 μm | | in which SiN$_{y1}$:H and SiN$_{y2}$:H designate nitride materials deposited with silane flow rates of 4.50 and 4.30 sccm, respectively.

Figure 3:
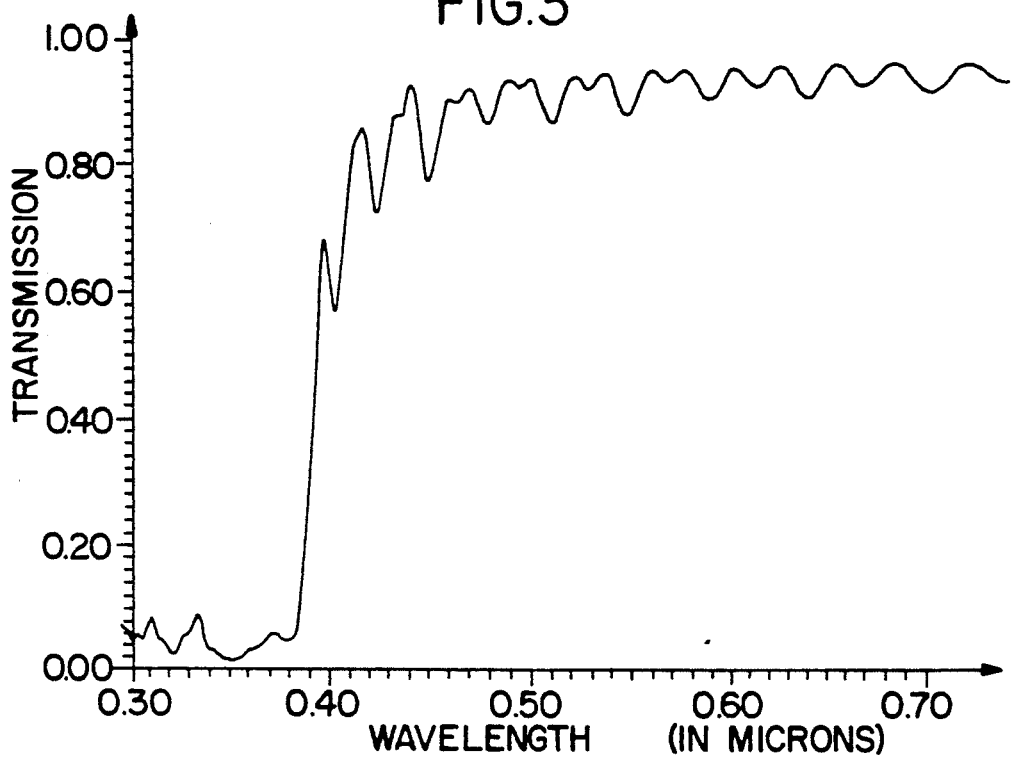
Figure 4:
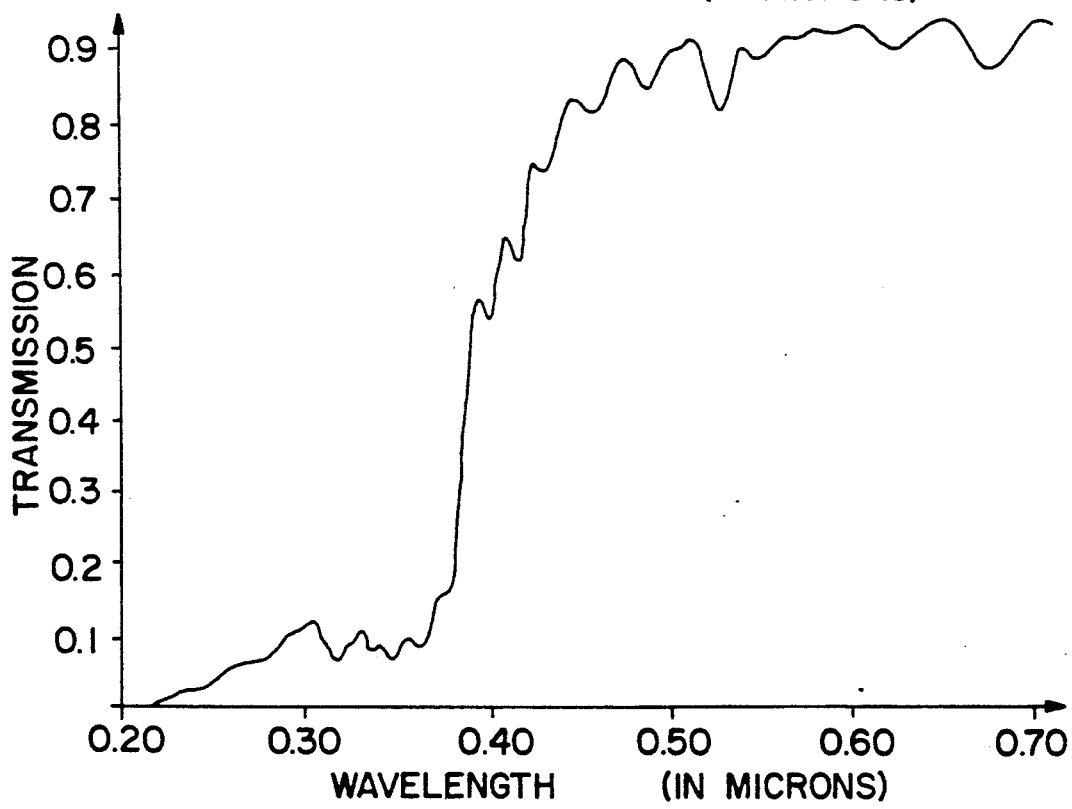
Figure 5:
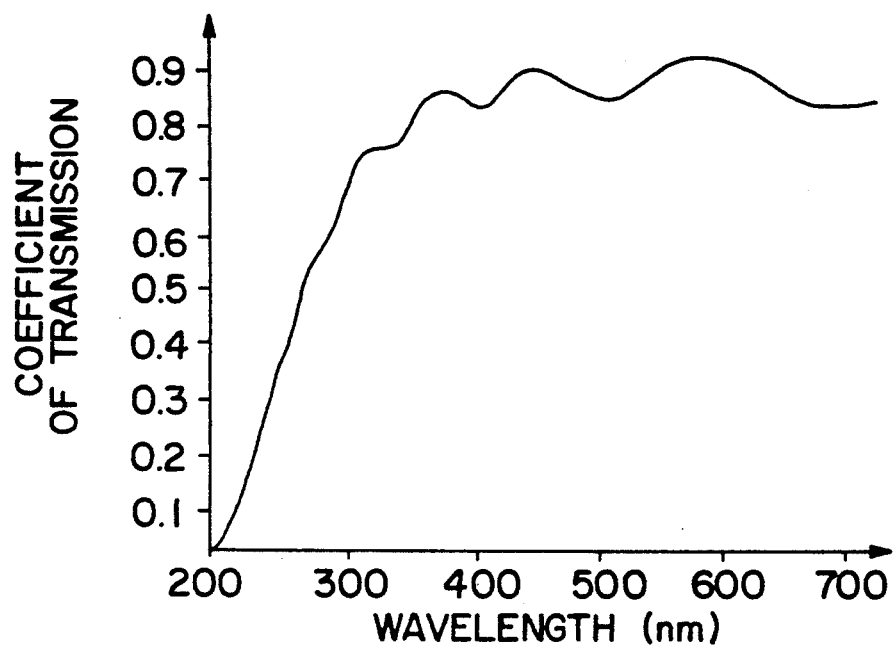
Figure 6:
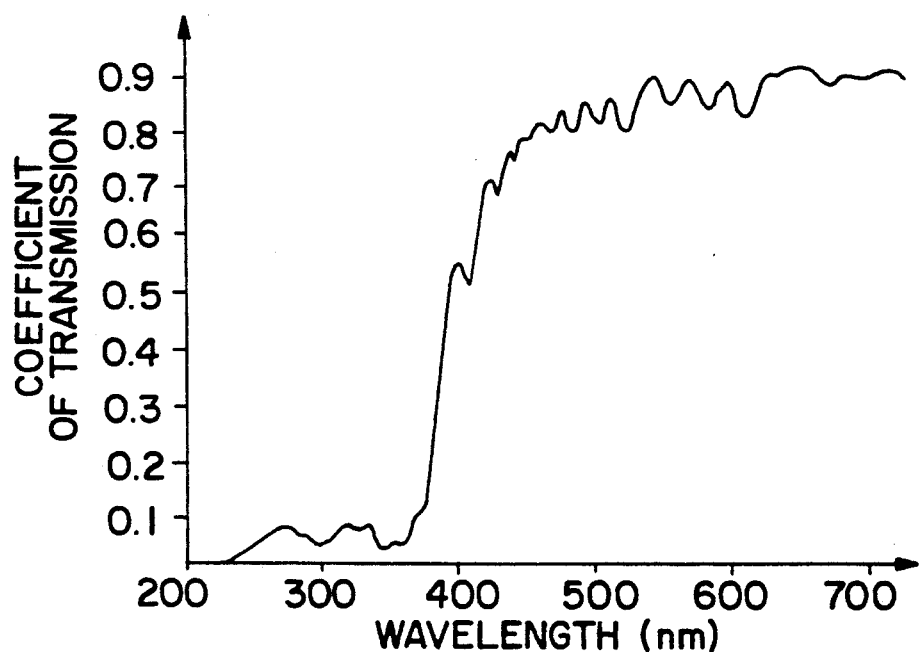

The transmission calculated for this structure from the optical constants of the materials of the composition, is shown in FIG. 3 at the same time as the transmission measured on the actual multilayer deposited on quartz (FIG. 4) and there is shown in FIGS. 5 and 6 the coefficient of transmission of a monolayer of a-SiN$_y$:H of about 1 μm (FIG. 5) and of the multilayer according to the invention (FIG. 6).

The following improvements will be noted:
  the extent of the transition zone between transparency and substantially no transmission has been very greatly
  the coefficient of transmission at 365 nm, a wavelength particularly harmful to polycarbonate, is less than 0.1,
  the increase of the coefficient of transmission of UV is very greatly attenuated relative to a pure interferential filter.

Preliminary tests made with laboratory spectral UV lamps have given the following results for specimens of polycarbonate coated with the preceding structure:
  no detectable modification of the specimen after 4,000 hours of exposure to 365 nm (on the unprotected specimen, the hard film of SiO$_x$ delaminates after 20 hours),
  no visible yellowing after 500 hours at 254 nm (the second unclad specimen is markedly yellow).

As to the thermomechanical properties, a very marked improvement has been observed with respect to monolayer filters of SiN$_y$:H. A specimen has been provided by depositing on a substrate of polycarbonate preliminarily activated, the adhesion layer, the anti-UV filter and a hard layer of $SiO_2$:H of 3 μm, according to the process of the invention. The specimen resists ten thermal cycles of $-40°$ to $+80°$ C. in dry atmosphere and ten identical specimens in atmosphere saturated with water vapor.

The applications of the invention are those in which the transparent polycarbonate should be protected from aging induced by UV as well as comprise a hard anti-abrasion coating, and especially when severe accelerated tests are imposed as to the behavior from UV and equally severe conditions as to thermo-mechanical properties, for example automobile headlight lenses and lenses of eyeglasses.

The concept, of the invention can be generalized for all cases in which there is required an optical filter with a wide band or pass base with an abrupt cutoff, this latter being adapted to be substantially displaced in the UV/visible range and acting on the thicknesses and the compositions of the layers of amorphous alloys of silicon via the values of the parameters of deposition. Different amorphous alloys of silicon (oxides, nitrides, carbides...) may be used as a function of the functional requirements, the composition of these alloys being easily controllable over a wide band in a PECVD silane process.

We claim:

1. A multilayer coating for an optical polymeric substrate comprising at least three superimposed pairs of paired first and second layers, the first layer having a low refractive index and the second layer having a higher refractive index, the second layer of each pair forming part of an adsorptive system and the superimposed pairs forming an interferential system having a reflectance window encompassing the absorption-to-transparence wavelength transition band of the adsorptive system, each second layer consisting of a substoichiometric hydrogenated silicon nitride material, and each first layer being a hydrogenated silica material further exhibiting higher thermomechanical properties than the material of the second layer.

2. The multilayer coating of claim 1, wherein the material of each first layer is a quasi-stoichiometric hydrogenated silica.

3. A multilayer coating for an optical polymeric substrate comprising at least two superimposed series of at least two superimposed pairs of paired first and second layers, the paired first and second layers in a series having respective first and second thicknesses different from the thicknesses of paired first and second layers in the other series, the first layer having a low refractive index and the second layer having a higher refractive index, the second layer of each pair forming part of an adsorptive system and the superimposed pairs forming an interferential system having a reflectance window encompassing the absorption-to-transparency wavelength transition band of the adsorption system, each second layer consisting of a sub-stoichiometric hydrogenated silicon nitride material, and each first layer being a material further exhibiting higher thermomechanical properties than the material of the second layer, said coating having the following layer structure from the polymeric substrate:

| | | |
|---|---|---|
| $SiO_2$:H | 1000Å | |
| $SiN_{y1}$:H | 390Å | |
| $SiO_2$:H | 530Å | } × 2 layers |
| $SiN_{y1}$:H | 390Å | |
| $SiO_2$:H | 620Å | } × 6 layers |
| $SiN_{y1}$:H | 480Å | |
| $SiO_2$:H | 700Å | } × 6 layers |
| $SiN_{y1}$:H | 560Å | |
| $SiO_2$:H | 740Å | } × 6 layers |
| $SiN_{y2}$:H | 620Å | |
| $SiO_2$:H | 3.0 μm | | in which $SiN_{y1}$:H and $SiN_{y2}$:H designate nitride materials deposited by silane flow of 4.50 and 4.30 sccm, respectively.

* * * * *